United States Patent
Crayford

(10) Patent No.: US 6,255,969 B1
(45) Date of Patent: *Jul. 3, 2001

(54) CIRCUIT AND METHOD FOR HIGH SPEED BIT STREAM CAPTURE USING A DIGITAL DELAY LINE

(75) Inventor: Ian Crayford, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/992,949

(22) Filed: Dec. 18, 1997

(51) Int. Cl.$^7$ ........................................ H03M 9/00
(52) U.S. Cl. .............................. 341/100; 341/101
(58) Field of Search ........................ 341/100, 101, 341/143; 375/130, 138, 373; 377/20; 326/50, 62

(56) References Cited

U.S. PATENT DOCUMENTS

| | | |
|---|---|---|
| 4,677,648 * | 6/1987 | Zurfluh ............................ 375/376 |
| 5,132,572 | 7/1992 | Woo . |
| 5,166,959 * | 11/1992 | Chu et al. ........................ 377/20 |
| 5,220,216 * | 6/1993 | Woo ................................ 326/50 |
| 5,227,679 | 7/1993 | Woo . |
| 5,243,625 | 9/1993 | Verbakel et al. . |
| 5,264,745 * | 11/1993 | Woo ................................ 326/62 |
| 5,349,612 | 9/1994 | Guo et al. . |
| 5,363,419 | 11/1994 | Ho . |
| 5,367,542 | 11/1994 | Guo . |
| 5,400,370 | 3/1995 | Guo . |
| 5,425,053 | 6/1995 | Matsumoto . |
| 5,452,333 | 9/1995 | Guo et al. . |
| 5,457,336 | 10/1995 | Fang et al. . |
| 5,457,719 * | 10/1995 | Guo et al. ....................... 375/373 |
| 5,828,250 * | 10/1998 | Konno ............................. 327/116 |
| 5,923,711 | 7/1999 | Wilming . |
| 6,091,348 * | 7/2000 | Crayford ......................... 341/100 |

* cited by examiner

Primary Examiner—Patrick Wamsley

(57) ABSTRACT

A digital delay line, comprising adjustable digital delay elements, receives and buffers an incoming bit stream by repeatedly delaying bits of the bit stream for a specific period of time. The outputs of selected adjustable digital delay elements are tapped for inspecting in parallel a specific pattern of bits of the bit stream. A programmable counter counts bit periods and generates a latch control signal to latch those specific bits at any offset within the bit stream before the entirety of the bit stream is received.

18 Claims, 3 Drawing Sheets

CIRCUIT AND METHOD FOR HIGH SPEED BIT STREAM CAPTURE USING A DIGITAL DELAY LINE

RELATED APPLICATIONS

This application is related to the following commonly assigned applications:

1. "Circuit and Method for MTL Decoding, Descrambling, and Error Detection," Ser. No. 08/992,963 filed on Dec. 18, 1997 by Ian Crayford now U.S. Pat. No. 6,078,627.

2. "Circuit and Method for On-the-Fly Bit Detection and Substitution," Ser. No. 08/992,568, filed on Dec. 18, 1997 by Ian Crayford.

TECHNICAL FIELD

The invention relates generally to digital communications and more particularly to capturing specified bits of a high-speed bit stream.

BACKGROUND ART

In serial based communications systems, data is transmitted serially between network nodes in a bit stream, which comprises a sequence of separate bits, evenly spaced by a bit period. The speed at which a node can process a bit stream in order to examine the information contained therein is determined by, among other factors, the data rate of the bit stream and the bit stream processing latency. The data rate of a bit stream is the inverse of the bit period, and the bit stream processing latency is the delay from the time the bit stream arrives at the node to the time the individual bits are available for inspection.

In conventional systems, the data rate is limited for a variety of reasons. For example, an incoming bit stream is usually stored for processing in a random access memory (RAM) buffer, such as a dynamic RAM (DRAM) buffer and static RAM (SRAM) buffer. Thus, the data rate of a bit stream can be limited by the speed of these memories.

Furthermore, the entire bit stream is typically stored in she RAM buffer before bits of the bit stream may be inspected. Accordingly, the processing latency depends on the size of the incoming bit stream and the rate at which the bit stream can be handled.

As another example, processor intervention may be required to handle the incoming bit stream. The speed of the processor, therefore, can further limit the data rate of the bit stream. Processors can also be relatively costly and require substantial additional hardware and software resources for functions unnecessary to high-speed bit stream capture. If, however, a processor already dedicated for another task is shared, then processing the bit stream reduces the performance of the shared processor.

DISCLOSURE OF THE INVENTION

There exists a need for a circuit and method that can process high-speed data transmissions of bit streams.

There exists a need for a circuit and method that can inspect bits of a bit stream without storing the bits of the bit stream into a RAM buffer.

There exists a need for a circuit and method that can inspect bits of a bit stream without storing the entire bit stream into a RAM buffer.

There exists a need for a circuit and method that can inspect bits of a bit stream without processor intervention.

These and other needs are met by the present invention, in which a bit stream is buffered in a high-speed, digital delay line. This digital delay line is tapped at rar's coins for outputting specified bits of the bit stream in parallel. These specified bits are latched according to a signal generated by a programmable counter so that any pattern of bits at any offset from the start of the bit stream may be observed, before the entire bit stream is received.

According to one aspect of the present invention, a high-speed bit capture circuit comprises a digital delay line for receiving and delaying a bit stream. The digital delay, line includes digital delay elements and taps. Each digital delay element is coupled in series, and each tap is coupled to output of a distinct digital delay element. The circuit also comprises a latch having latch inputs coupled to the taps and a latch control input for latching the parallel data on the latch inputs in response to a latch control signal. A counter counts a prescribed number of bit periods from the start of the bit stream and, when the prescribed number is counted, the counter generates the latch control signal.

Using a digital delay line enables the bit stream to be buffered at a high-speed without RAM or processor intervention. Further, the digital delay line enables bits of the bit stream to be simultaneously available before all of the bit stream has been received.

Another aspect of the present invention is a method of capturing bits from a high-speed bit stream. The method comprises the step of repeatedly delaying, for a bit period, bits from the high-speed bit stream. These bits are tapped to produce parallel data. The method also has the steps of counting a prescribed number of bit stream periods of the high-speed bit stream and latching the parallel data when the prescribed number of bit stream periods is counted. Repeatedly delaying bits of the bit stream enables the bit stream to be buffered at a high-speed without RAM or processor intervention. Further, tapping these bits enables them to be simultaneously available before all of the bit stream has been received.

Additional objects, advantages, and novel features of the present invention will be set forth in part in the detailed description which follows, and in part will become apparent upon examination or may be learned by practice of the invention. The objects and advantages of the invention may be realized and obtained by means of the instrumentalities and combinations particularly pointed out in the appended claims.

BRIEF DESCRIPTION OF THE DRAWINGS

The present invention is illustrated by way of example, and not by limitation, in the figures of the accompanying drawings, wherein elements having the same reference numeral designations represent like elements. throughout and wherein.

BEST MODE FOR CARRYING OUT THE INVENTION

A circuit and method for high-speed bit stream capture are described. In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

HIGH-SPEED DIGITAL DELAY LINE

Figure 1A:
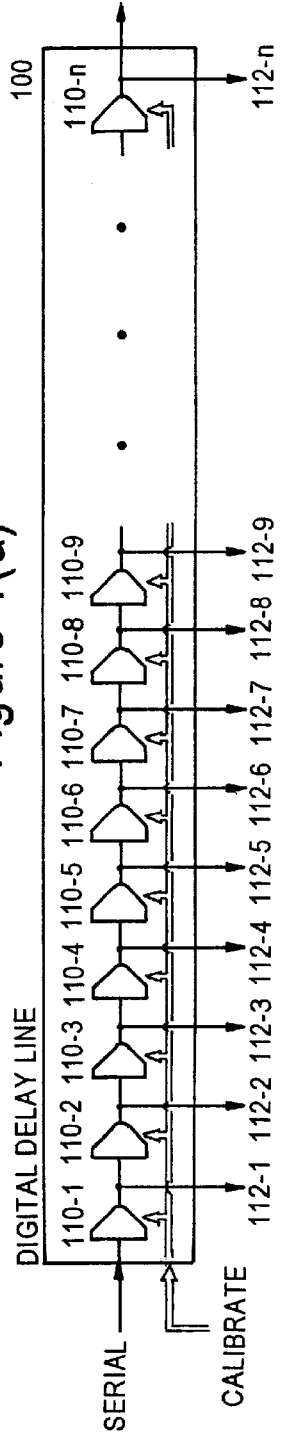
FIG. 1(a) is a block diagram of a digital delay line according to an embodiment.

FIG. 1 is a block diagram of an exemplary high-speed, digital delay line 100 with which the present invention can be implemented. The exemplary high-speed digital delay line 100 receives a serial bit stream comprising a plurality of bits spaced at a regular interval, the "bit stream clock period." Digital delay line 100 delays the serial bit stream so that an identical serial bit stream is output but with a phase delay of an integral number of bit stream clock periods.

Specifically, digital delay line 100 comprises a plurality of digital delay elements 110-1 to 110-n, coupled in series. Each of the digital delay elements 110-1 to 110-n delays a digital signal for a specified amount of time. Digital delay line 100 may comprise an arbitrary number n of digital delay elements, depending upon any constraints inherent in the semiconductor implementation utilized or other practical considerations. For example, digital delay line 100 can comprise tens of thousands of digital delay elements. Since each of the digital delay elements 110-1 to 110-n of digital delay line 100 is constructed during the same manufacturing process on the same semiconductor substrate, it is likely that the operating characteristics, hence the delay period, of each digital delay element are nearly identical.

When the common delay period equals the bit stream clock period, each individual bit of the serial bit stream input into digital delay line 100 is being delayed by a distinct digital delay element. Thus, outputs of a plurality of digital delay elements may be tapped to simultaneously view a plurality of bits of the serial bit stream. Accordingly, digital delay line 100 comprises a plurality of taps 112-1 to 112-n coupled to the outputs of the respective digital delay elements 110-1 to 110-n for viewing portions of the serial bit stream in parallel.

The delay characteristics of any digital circuit will vary from chip to chip and over time because of unavoidable variations in manufacturing and operating conditions. Thus, there is a need to calibrate the delay period of each of the digital delay elements 110-1 to 110-n to match the bit stream clock period. According to one approach, both the delay period and the bit stream clock period are synchronized to a reliable, precise reference clock, such as a crystal oscillator.

The delay period of each of the digital delay elements 110-1 to 110-n is preferably adjustable by a digital command code as a calibration signal. This calibration signal is produced with reference to a reliable, precise clock signal, preferably by an on-chip digital servo circuit (not shown) such as described in the commonly assigned U.S. Pat. No. 5,457,719, issued to Guo et al. on Oct. 10, 1995. Briefly, the on-chip digital servo circuit comprises an adjustable digital delay line of its own, which it monitors and continually adjusts with a calibration signal in a feedback loop. The calibration signal is shared with other systems on the chip.

Figure 1C:
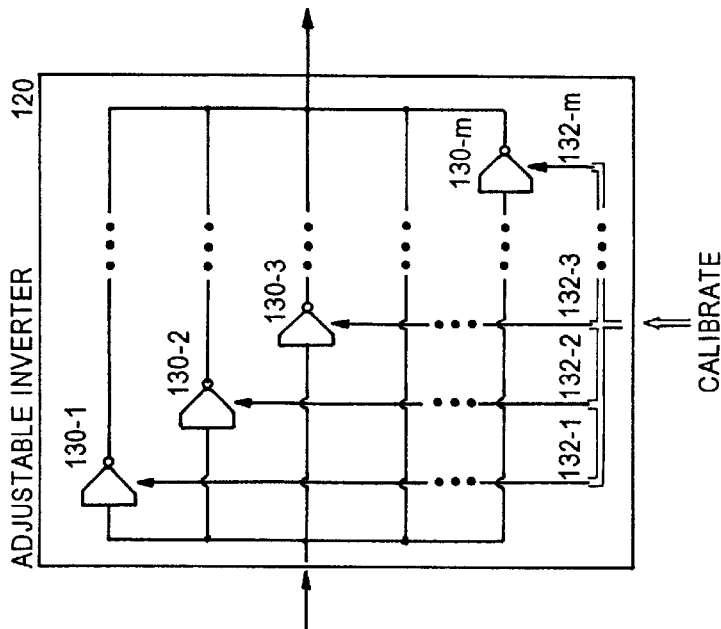
FIG. 1(c) is a block diagram of an adjustable inverter according to an embodiment.
Figure 1B:
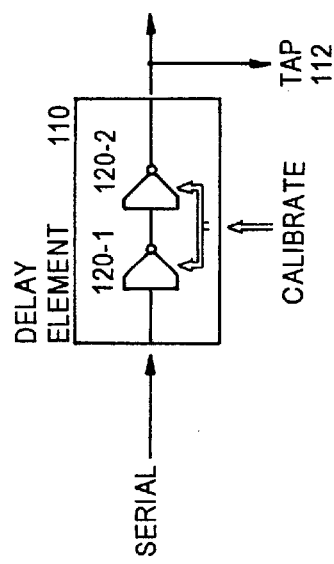
FIG. 1(b) is a block diagram of an adjustable delay element according to an embodiment.

Referring to FIG. 1(b), each adjustable digital delay element 110 comprises two adjustable inverters 120-1 and 120-2, coupled in series. each receiving the aforementioned calibration signal. Thus, the delay period of each of the two adjustable inverters 120-1 and 120-2 is one-half of the bit stream clock period and is controlled by the calibration signal.

Referring to FIG. 1(c), each adjustable inverter 120 in a preferred embodiment comprises a plurality of switchable inverters 130-1 to 130-m coupled in parallel. Each of the switchable invereters 130-1 to 130-m is switched on or off by a bit of the calibration signal. Thus, two of the parameters that determint the propagation delay of an inverter, the P-channel size to N-channel size ration and the driving power, may be determined for precise control over the delay period. Switchable inverters are described in further detail in the commonly assigned U.S. Pat. No. 5,220,216, issued to Woo on Jun. 15, 1993, and the commonly assigned U.S. Pat. No. 5,227,679, issued to Woo on Jul. 13, 1993.

Accordingly, digital delay line 100 comprises a series of adjustable digital delay elements 110-1 to 110-n, each of which provides a uniform delay period synchronized to a reference clock period according to a calibration signal. Moreover, each adjustable inverter 120 can have a consistent delay period of as little as 70

Thus each adjustable digital delay element 110 can have a consistent delay period of as little of 140 ps. Therefore, digital delay line 100 is high-speed, capable of processing a serial bit stream at data rates up to about 7 GHz. Furthermore, digital delay line 100 provides parallel taps 112-1 to 112-n for simultaneously viewing in parallel any portion of a high-speed serial bit stream.

HIGH-SPEED BIT STREAM CAPTURE

Figure 2:
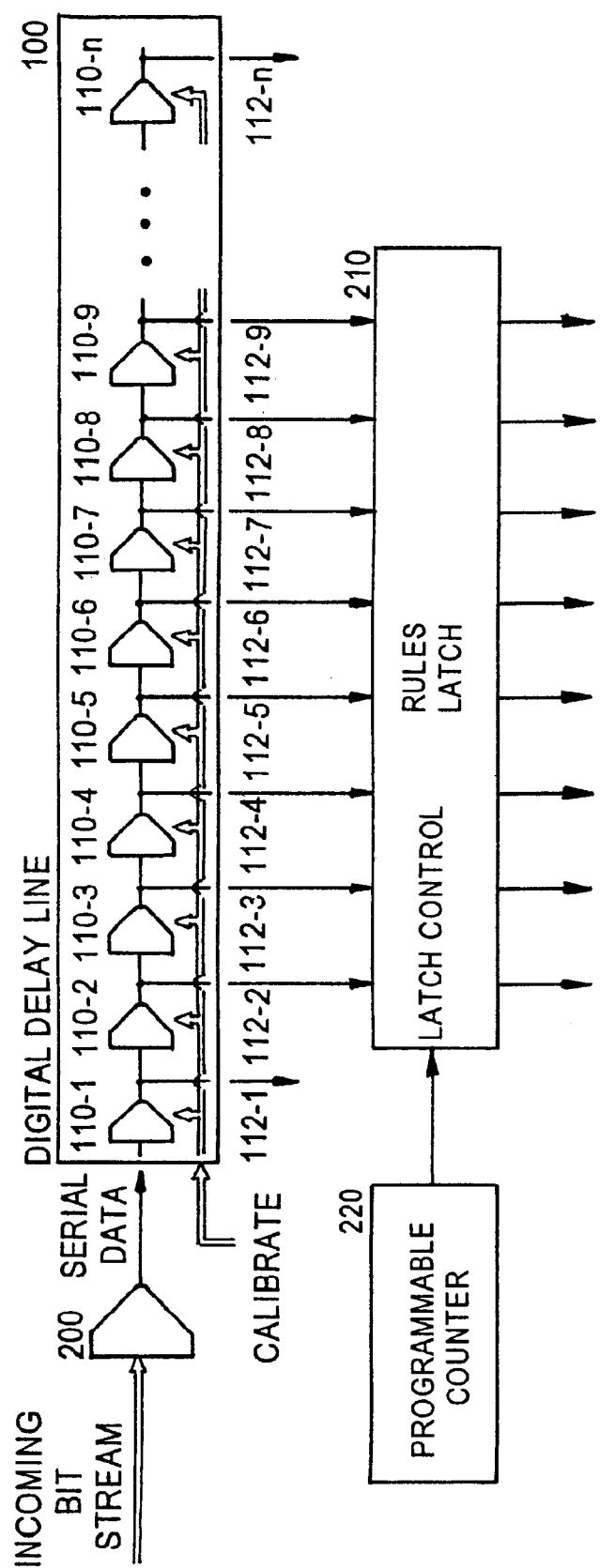
FIG. 2 is a block diagram of a high-speed bit capture circuit according to an embodiment.
Figure 3B:
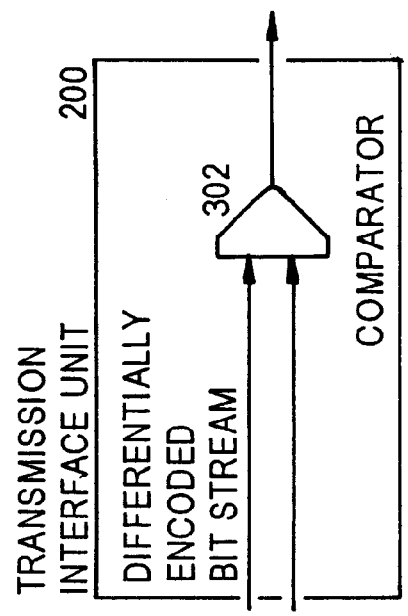
FIGS. 3(a) and 3(b) depict a transmission interface unit according to two embodiments.
Figure 3A:
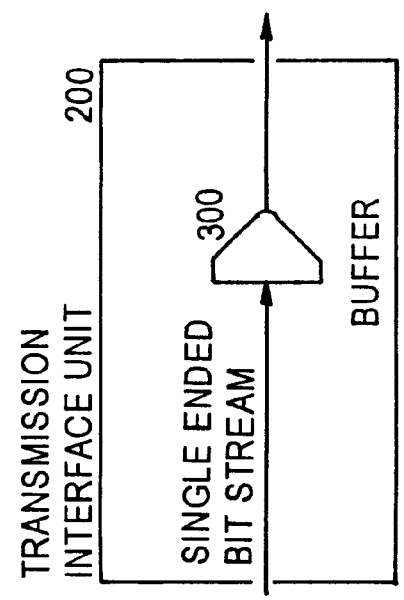

FIG. 2 is a block diagram of a high-speed bit stream capture circuit. An incoming bit stream is received by a transmission interface unit 200 and processed to be a signal suitable for driving CMOS circuitry, e.g. digital delay line 100. In one embodiment, shown in FIG. 3(a) the transmission interface unit 200 comprises a buffer/level shifter 300 which receives a single ended bit stream, such as a TTL or CMOS signal, and adjusts the driving power and voltage to produce a bit stream that can drive CMOS circuitry. In another embodiment, shown in FIG. 3(b), the transmission interface unit 200 comprises a comparator 302 for receiving a differentially encoded bit stream, such as an ECL signal, and producing therefrom a single ended bit stream suitable for driving CMOS. One example of an ECL-to-CMOS comparator that may be used to implement an embodiment of the present invention is disclosed in the commonly assigned U.S. Pat. No. 5,264,745, issued to Woo on Nov. 23, 1993.

The bit stream output from transmission interface unit 200 is applied to digital delay line 100, wherein each of the digital delay elements 110-1 to 110-n is calibrated to delay a bit of the bit stream for an interval equal to the bit period. In this manner, each received bit of the bit stream (up to a maximum of n bits) is found at an output of a digital delay element 110. Accordingly, each output of a digital delay element 110 may be tapped to provide parallel data.

Rules latch 210 comprises a plurality of latch inputs which are coupled to some of the taps. A tap may be coupled to more than one latch input but typically is coupled to only one latch input. Although the figure shows taps 112-2 to 112-9 being coupled to latch inputs of rules latch 120, the number and location of these taps 112-1 to 112-9 are strictly for purposes of illustration. There is no requirement that these particular taps 112-1 to 112-9 be coupled to rules latch 120 nor even be consecutive. In fact, it is contemplated that any number of taps 112-1 to 112-n from any part of the digital delay line 110 may be coupled to rules latch 210 in any sequence, depending on the requirements of the particular environment in which the present invention is implemented.

The circuit also comprises a programmable counter 220 which is configured from counting the number of bit periods in the bit stream from the start of the bit stream. When the programmable counter 220 reaches a prescribed number, the programmable counter 220 generates a latch control signal which is applied to rules latch 210. When rules latch 210 receives the latch control signal, the parallel data present at the latch inputs are latched to provide a constant output until the next time the latch control signal is received.

The programmable counter 220 may receive an input that indicates what the prescribed number of bit periods to count is for modifying the prescribed number during the course of receiving the bit stream. In addition, the programmable counter 220 may be reset to count another prescribed number of bit periods. Thus, patterns of bits later in the bit stream can be conditionally inspected according to bit data near the beginning of the bit stream. In this manner, the high-speed bit capture circuit can observe a fixed or variable length of bits in the bit streams.

Therefore, any pattern of bits in the bit stream can be latched at any offset from the start of the bit stream, as soon as the bit data in the pattern arrives in the digital delay line 100. Accordingly, the processing latency is not dependent on the length of time to receive the entire bit stream but on a shorter amount of time when all the specified bits have arrived.

As mentioned above, the delay of the individual delay elements 110-1 to 110-n can be as little as 140 ps, which enables sit streams having a data rate up to 7 GHz to be processed without using a RAM or a processor to buffer the bit stream.

The advantages provided by the present invention make embodiments of the high-speed bit stream capture circuit amenable in a variety of situations and implementations.

For example, CRC (cyclic redundancy check) calculation can be performed as the bit stream is received to detect for errors. A CRC is calculated by applying a polynomial to successive blocks of a bit stream. For instance, the polynomial of $x^8+1$ specifies a CRC produced by exclusive ORing every eight-bit byte of the bit stream together. In this case, the rules latch 210 is coupled to taps 112-1 to 112-8, and the programmable counter 220 is configured to output a latch control signal at every eight bit stream periods.

As another example, other processing functions and polynomials can be applied to the bit stream. For instance, the bit stream could be encrypted and the applied processing function can decrypt the bit stream as it is received, reducing the latency in encrypted transmissions. In addition, the bit stream could be scrambled to reduce long strings of 1s or 0s in the transmission. Accordingly, a polynomial can be applied after the data is latched to descramble the bit stream.

As yet another example, the bit stream could contain addressing information, such as a destination address and source address. These addresses can be inspected for purposes of collecting statistics of network traffic.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A high-speed bit stream capture circuit, comprising:
a transmission interface unit for receiving an incoming bit stream and producing therefrom a high-speed bit stream;
a digital delay line coupled to said transmission interface unit, including a plurality of digital delay elements coupled in series and a plurality of taps, each tap coupled to the output of a distinct digital delay element of said plurality of digital delay elements, for receiving and delaying the high-speed bit stream;
a latch having a plurality of latch inputs, each latch input being coupled to a respective tap of said plurality of taps, and a latch control input for receiving a latch control signal for latching and outputting through a plurality of latch outputs parallel data at said plurality of latch inputs; and
a counter for counting to a prescribed number of bit stream periods from the start of said bit stream and, when said prescribed number of bit stream periods is counted, generating said latch control signal.

2. The high-speed bit capture circuit of claim 1, wherein:
said digital delay line further includes a calibration input for receiving a calibration signal; and
each of said plurality of digital delay elements comprises a calibration input for receiving said calibration signal and in response adjusts the delay period thereof.

3. The high-speed bit stream capture circuit of claim 2, wherein each digital delay element comprises:
a first adjustable inverter, having a first calibration input for receiving said calibration signal; and
a second adjustable inverter, having a second calibration input for receiving said calibration signal, coupled in series to said first switchable inverter.

4. The high-speed bit stream capture circuit of claim 1, wherein the delay period of each of said plurality of digital delay elements is the same.

5. The high-speed bit stream capture circuit of claim 1, wherein the delay period of each of said plurality of digital delay elements is at least 140 ps.

6. The high-speed bit capture circuit of claim 1, wherein each of said plurality latch inputs is coupled to a respective tap of said plurality of taps.

7. The high-speed bit capture circuit of claim 1, wherein said counter is configured for modifying said prescribed number according to a signal indicative of a new prescribed number of bit stream periods.

8. The high-speed bit capture circuit of claim 1, wherein the prescribed number is less than the total number of bit stream periods in said bit stream.

9. The high-speed bit capture circuit of claim 1, wherein said transmission interface unit includes a buffer for receiving a single ended bit stream and producing therefrom said high-speed bit stream applied to said digital delay line.

10. The high-speed bit capture circuit of claim 9, wherein said transmission interface unit includes a level shifter for shifting the voltage level of said single ended bit stream.

11. The high-speed bit capture circuit of claim 1, wherein said transmission interface unit includes a comparator for comparing a differentially encoded bit stream and producing therefrom said high-speed bit stream applied to said digital delay line.

12. A method of capturing bits from a high-speed bit stream, comprising the steps of:
receiving the high-speed bit stream;
repeatedly delaying by a delay period a plurality of bits from said high-speed bit stream;
tapping said plurality of bits in parallel to produce parallel data;
counting bit stream periods of said high-speed bit stream; and
latching said parallel data when a prescribed number of bit stream periods is counted.

13. The method of claim 12, further comprising the step of calibrating said delay period to be the same as said bit stream period.

14. The method of claim 12, further comprising the step of changing said prescribed number.

15. The method of claim 12, wherein said parallel data is latched before the entire said bit stream is delayed.

16. The method of claim 12, further comprising the step of level shifting said high-speed bit stream before said repeatedly delaying said high-speed bit stream.

17. The method of claim 12, further comprising the step of comparing differentially encoded voltages of said high-speed bit stream to produce a single ended bit stream.

18. The method of claim 12, wherein the step of repeated delaying includes the steps of applying the high-speed bit stream to a digital delay line.

* * * * *